United States Patent [19]

Adachi et al.

[11] Patent Number: 5,985,704
[45] Date of Patent: *Nov. 16, 1999

[54] METHOD FOR MANUFACTURING A SEMICONDUCTOR DEVICE

[75] Inventors: Hiroki Adachi; Akira Takenouchi; Yasuhiko Takemura, all of Kanagawa, Japan

[73] Assignee: Semiconductor Energy Laboratory Co., Ltd., Kanagawa, Japan

[*] Notice: Under 35 U.S.C. 154(b), the term of this patent shall be extended for 483 days.
Under 35 U.S.C. 154(b), the term of this patent shall be extended for
This patent is subject to a terminal disclaimer.

[21] Appl. No.: 08/568,792

[22] Filed: Dec. 7, 1995

Related U.S. Application Data

[63] Continuation of application No. 08/275,638, Jul. 15, 1994, abandoned.

[30] Foreign Application Priority Data

Jul. 27, 1993 [JP] Japan .................................. 5-204772

[51] Int. Cl.[6] .................................................. H01L 21/84
[52] U.S. Cl. .............................. 438/166; 438/142; 117/7; 117/8
[58] Field of Search ..................... 438/142, 149, 438/151, 153, 162, 163, 166

[56] References Cited

U.S. PATENT DOCUMENTS

| | | | |
|---|---|---|---|
| 4,059,461 | 11/1977 | Fan et al. .................................. | 437/84 |
| 4,132,571 | 1/1979 | Cuomo et al. ........................... | 437/111 |
| 4,174,217 | 11/1979 | Flatley ........................... | 148/DIG. 150 |
| 4,271,422 | 6/1981 | Ipri ............................................ | 437/84 |
| 4,277,884 | 7/1981 | Hsu .............................. | 148/DIG. 150 |
| 4,534,820 | 8/1985 | Mori et al. ............................... | 156/603 |
| 4,544,418 | 10/1985 | Gibbons ....................... | 148/DIG. 118 |
| 4,755,481 | 7/1988 | Faraone ..................................... | 437/62 |
| 5,147,826 | 9/1992 | Liu et al. ................................ | 437/233 |
| 5,173,446 | 12/1992 | Asakawa et al. ........................ | 437/111 |
| 5,275,851 | 1/1994 | Fonash et al. ........................... | 427/578 |

FOREIGN PATENT DOCUMENTS

| | | | |
|---|---|---|---|
| 57-028357 | 2/1982 | Japan . | |
| 1-187874 | 7/1989 | Japan ...................................... | 437/83 |
| 1-187875 | 7/1989 | Japan ...................................... | 437/83 |
| 2-140915 | 5/1990 | Japan ...................................... | 437/83 |
| 2-275641 | 11/1990 | Japan ...................................... | 437/83 |
| 3-280418 | 12/1991 | Japan ...................................... | 437/83 |
| 3-292741 | 12/1991 | Japan . | |
| 5-291295 | 11/1993 | Japan . | |

OTHER PUBLICATIONS

Lau, S., et al., "Solid Phase Epitaxy In Silicide Folming System", Thin Solid Films, 47(1977), pp. 313–322.

Kawazu, Y., et al., "Low Temperature Crystallization of Hydrogenated Amorphous Silico Induced by Nickel Silicide Formation", Jap. J. Appl. Phys., vol. 29, No. 12, Dec. 1990, pp. 2698–2704.

Boyd, I. W., et al., Applied Physics Letters, vol. 41, No. 2, Jul. 15, 1982, pp. 162–164.

Wolf et al., Silicon Processing, Lattice Press, 1986, vol. 1, pp. 198–219, 303–307.

Ghandhi, S. K., VLSI Fabrication Principles, John Wiley & Sons, 1983, pp. 419–429.

Zorabedian, et al., "Lateral Seeding . . . " in MRS Sym. Proc., vol. 33, 1984, Lam et al. ed., pp. 81–86.

*Primary Examiner*—Charles Bowers
*Assistant Examiner*—Martin Sulsky
*Attorney, Agent, or Firm*—Sixbey, Friedman, Leedom & Ferguson, P.C.; Gerald J. Ferguson, Jr.; Jeffrey L. Costellia

[57] ABSTRACT

A method for forming a silicon island used for forming a TFT or thin film diode comprises the step of patterning a silicon film with a photoresist mask. In order to prevent the contamination of the semiconductor film due to the photoresist material, a protective film such as silicon oxide is interposed between the semiconductor film and the photoresist film. Also, the protective film is preferably formed by thermal annealing or light annealing in an oxidizing atmosphere.

29 Claims, 7 Drawing Sheets

METHOD FOR MANUFACTURING A SEMICONDUCTOR DEVICE

This application is a Continuation of Ser. No. 08/275,638 filed Jul. 15, 1994, now abandoned.

FIELD OF THE INVENTION

The present invention relates to a method for manufacturing a semiconductor device which includes a non-single crystalline semiconductor layer formed on a substrate, for example, an insulating substrate such as glass. In particular, the semiconductor device is of an insulated gate type such as a thin film transistor (TFT) or thin film diode (TFD). The present invention is further related to a manufacture of a thin film integrated circuit utilizing the TFT or TFD, specifically a thin film integrated circuit for an active matrix liquid crystal display device.

DESCRIPTION OF PRIOR ART

In recent years, active matrix liquid crystal device and an image sensor have been developed which utilize a semiconductor device having TFTs formed on an insulating substrate such as glass for driving pixels or as a peripheral circuit.

Silicon in the form of a thin film is most generally used for forming TFTs of these semiconductor devices. Generally, thin film silicon semiconductors are classified to (a) amorphous silicon and (b) crystalline silicon. While amorphous silicon is easy to form at a relatively low temperature, electrical characteristics of the amorphous silicon is inferior to crystalline silicon.

In usual, when manufacturing TFTs with a silicon film, a pattering of the silicon film has been used to isolate each element from one another. A photoresist has been used to pattern the silicon film as a mask.

On the other hand, it has been strongly required to avoid any contamination of silicon during the fabrication process of TFTs as much as possible since an active semiconductor region of a TFT is very sensitive to impurities. As a source of a contamination, the air and the handling with human hands are known. However, this problem has not been completely solved yet.

SUMMARY OF THE INVENTION

It is an object of the present invention to provide a semiconductor device such as a TFT or image sensor having a high quality by solving the foregoing problems.

It is another object of the present invention to provide a semiconductor device having a semiconductor film with an improved crystallinity.

The inventors of the present invention first recognized that a photoresist which is used for patterning a semiconductor layer is one of the sources of the contamination causing properties of the TFTs degrade. Based on this recognition, the primary feature of the invention is to provide a protective film between the photoresist and the semiconductor layer in order to prevent the impurity elements contained in the photoresist from invading into the semiconductor layer.

BRIEF DESCRIPTION OF THE DRAWINGS

The foregoing feature and other features of the invention will be described in detail with reference to the attached drawings in which.

DESCRIPTION OF THE PREFERRED EMBODIMENTS OF INVENTION

Figure 1A:
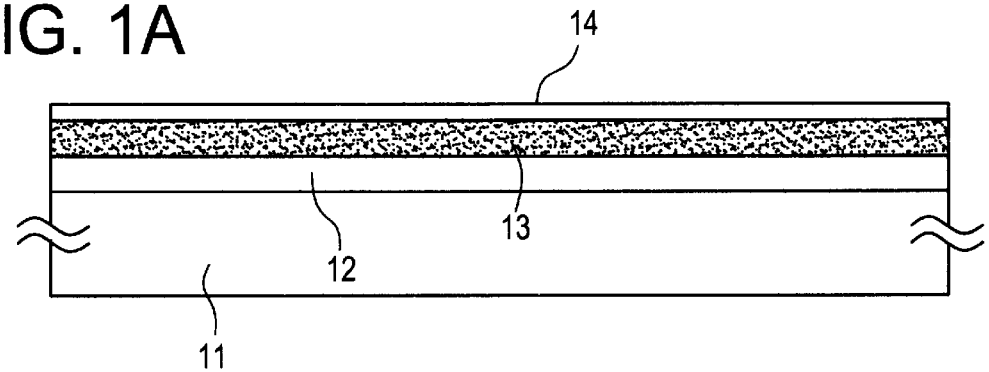
FIGS. 1A–1E show cross sectional diagrams showing a manufacturing process in accordance with a first example of the invention.

In this invention, inorganic materials such as silicon oxide or silicon nitride or a mixture thereof are usable as a blocking layer which is to be formed on a semiconductor layer prior to a provision of a photoresist thereon. In particular, the blocking layer comprises an oxide which is formed by oxidizing a surface of the semiconductor layer. Namely, the oxide is formed by subjecting the semiconductor to a heat annealing at a such a temperature that the substrate is not damaged or to a photoannealing, in an oxidizing atmosphere such as oxygen, oxygen nitride and ozone. Also, in this invention, the photoannealing means a process in which a laser light or a light having an enough intensity as equivalent to laser light is used. Usable as light sources are industrially available lasers such as excimer laser, YAG laser, $CO_2$ laser or ruby laser, xenon lamp, krypton arc lamp, halogen lamp and the like.

When employing the heat annealing in this invention, it is desirable to use a temperature which does not cause a substrate bend or contract, for example, it is preferable to use a temperature ranging 400° C. to 700° C., more preferably 500° C. to 600° C. The thickness of the oxide can be controlled by changing the temperature and the length of the heat annealing. In this invention, it is desirable to make the oxide layer pinhole free and as thin as possible, for example, 20Å to 100Å.

Also, it is possible to use a higher temperature if there is no patterning provided on the substrate. Furthermore, if the substrate is provided with a pattern, although it is desirable to use a temperature which is lower than a strain point of the substrate, a higher temperature may be used if the substrate is thermally treated in advance in order to release internal stress of the substrate and thus to minimize a contraction of the substrate in the subsequent heating step.

The foregoing explanation is also applicable to a photoannealing. However, the use of a pulsed laser is advantageous in that the substrate is not heated in either partly or wholly. Also, it is more effective to heat a substrate at not higher than 600° C., preferably not higher than 400° C. during the photoannealing. Further, both of the photoannealing and heat annealing may be employed in turn or simultaneously. For example, the photoannealing may be done after the heat annealing or vice versa.

The semiconductor layer may have either one of an amorphous structure or crystalline structure when performing the foregoing treatments. In the case of crystallizing a silicon film by heating, it is possible to crystallize it at a lower temperature than usual solid phase crystallization temperature by using a metal element such as nickel for promoting the crystallization. As the metal element for promoting the crystallization usable are VIII group elements of Fe, Co, Ni, Ru, Rh, Pd, Os, Ir, and Pt and other elements such as Sc, Ti, V, Cr, Mn, Cu, Zn, Au and Ag. Moreover, it is possible to further increase the crystallinity of the silicon film after this low temperature heating, by subjecting it to a laser annealing or a light annealing with a sufficiently intense light.

Figure 7:
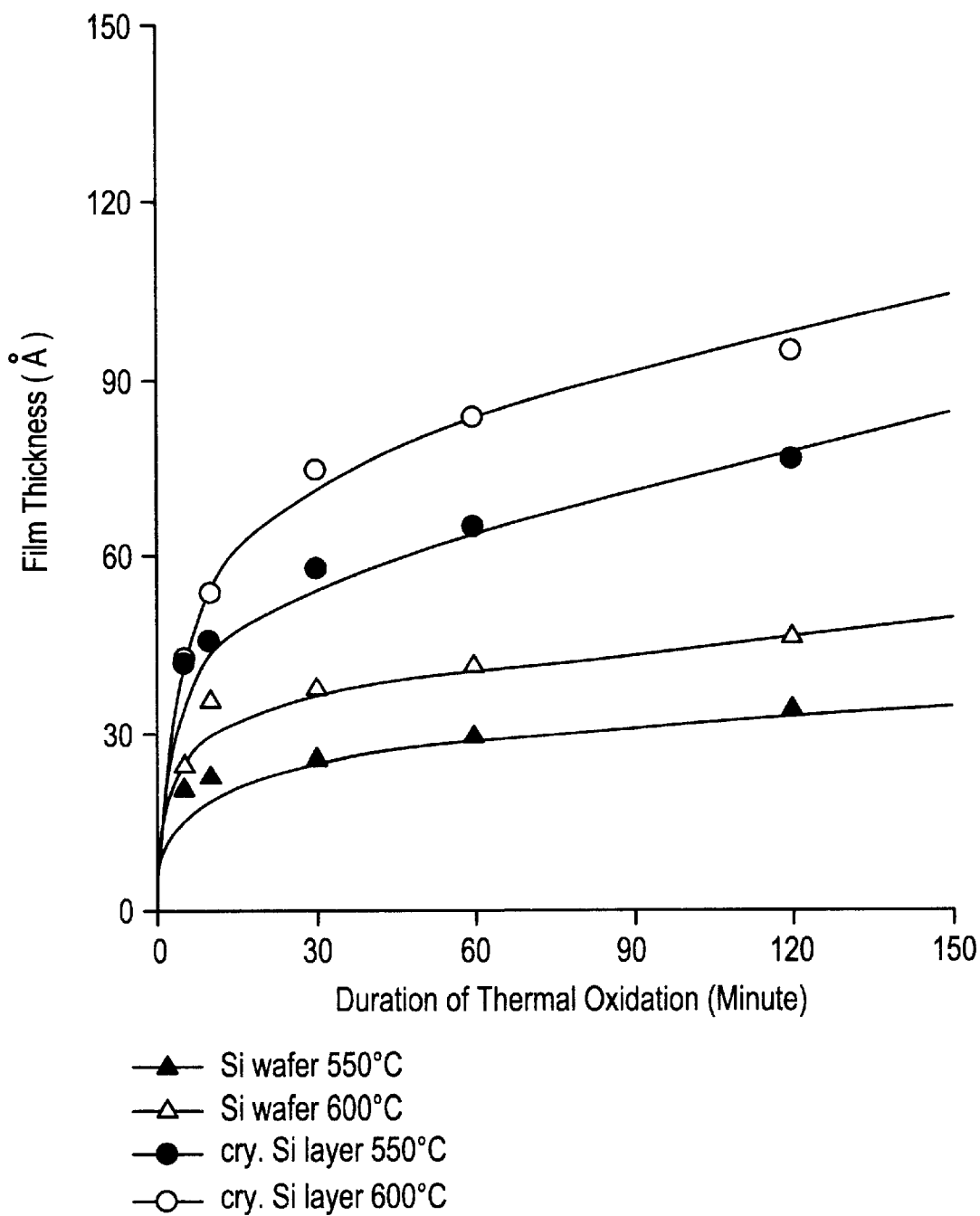
FIG. 7 shows a relation among thickness, oxidation period and oxidation temperature with respect to a thermal oxide film in accordance with the present invention.

FIG. 7 shows a relation among thickness of a thermal oxide film, duration of oxidation process and heating temperature with respect to an oxide film formed by the low temperature heat oxidation. A single crystalline silicon wafer and a crystalline silicon film which is obtained by growing an amorphous silicon film in a solid phase are used to be subjected to the oxidation. Also, the thickness of oxide films is obtained in a manner in which a thermal oxide film is obtained by heating a single crystalline silicon wafer at 900° C., the thickness of this oxide film is measured by an elipsometry method, then the thickness of the target film is calculated from an etching period thereof by using an etching rate of the 900° C. thermal oxide film. It is to be understood from FIG. 7 that the crystalline silicon film is oxidized two times faster than the single crystalline silicon wafer. Also, there is no tendency observed that the thickness of the oxide film of the crystalline silicon film saturates with respect to the oxidation duration.

In accordance with the present invention, a thermal oxide film having 30Å to 60Å thickness can be obtained for about 30 minutes by annealing at 550° C. in a dry oxygen. This oxide film is pinhole free, dense and uniform in thickness. Also, the interface between the silicon layer and the oxide layer is very excellent. It should be noted that the interface condition is not so excellent in the case of forming the oxide layer by sputtering because the surface of the silicon is damaged.

Because of the excellent interface condition, an excellent silicon surface can be obtained after removing the oxide film. Therefore, if the semiconductor film is used for a TFT, various characteristics (carrier mobility, subthreshold value (S-value) or the like) and the reliability can be improved.

In the case of using a photoannealing, the thickness of the oxide film is determined by the total amount of the light incident on the surface. The interface condition in the case of the photoannealing is as excellent as that in the case of the heat annealing. Thus, an excellent TFT can be obtained.

EXAMPLE 1

FIGS. 1A through 1E show cross sectional views of a manufacturing process in accordance with the first example of the present invention.

Initially, a silicon oxide film 12 is formed on a substrate 11 (Corning 7059) by sputtering to a thickness of 2000Å. It is preferable to heat the substrate prior to or after the formation of the silicon oxide film 12 at a temperature higher than a strain point of the substrate and then cool it below the strain point at a cooling rate of 0.1–1.0° C./minute. This treatment suppresses the contraction of the substrate due to subsequent heating steps (including the oxidation process of the invention with IR radiation or heat annealing), making a mask aligning process easier. In the case of the Corning 7059 like in this example, the substrate is heated at a temperature 620°–660° C. for 1 to 4 hours then cooled to 450–590° C. at cooling rate of 0.1–1.0° C., preferably 0.1–0.3° C., at which temperature the substrate is taken out.

Then, an amorphous silicon film 13 is deposited on the silicon oxide film 12 by a plasma CVD to a thickness of 500Å to 1500Å, for example, 1000Å. Further, a silicon oxide film 14 is formed on the amorphous silicon 13 by a plasma CVD to a thickness of 1000Å. The silicon oxide film 14 functions as a protective film ("cap-layer") when subjecting the amorphous silicon to thermal crystallization. For forming the silicon oxide film 14, tetraethoxysilane $Si(OC_2H_5)_4$ (so called TEOS) and oxygen are used as a precursor gas in the plasma CVD. The substrate temperature during the deposition is 200–450° C., for example, 250° C. Then, the amorphous silicon film 13 is crystallized by heating at 600° C. for 48 hours in nitrogen at the atmospheric pressure. The thickness of the cap-layer should be at least 500Å in order to improve the density and the surface condition of the crystalline silicon film.

Figure 1B:
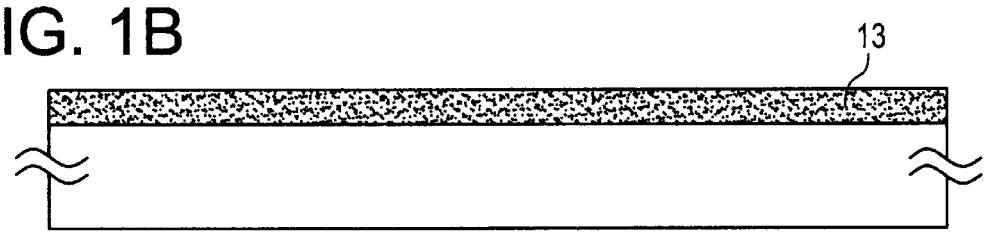

After the crystallization, the silicon oxide film 14 is removed by etching using a water solution of 1/10 HF and fluoride ammonium (1/10BHF) as an etchant. Thus, the surface of the silicon film 13 is exposed as shown in FIG. 1B.

Figure 1C:
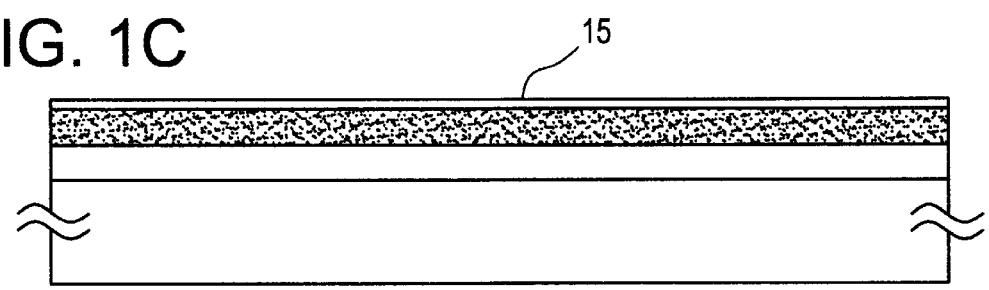

Then, in accordance with the present invention, the surface of the silicon film 13 is thermally oxidized in a flow of oxygen (7 cm³/second) at 550° C. to 600° C. As a result, a silicon oxide film 15 is obtained to a thickness of 40–50Å as shown in FIG. 1C.

Figure 1D:
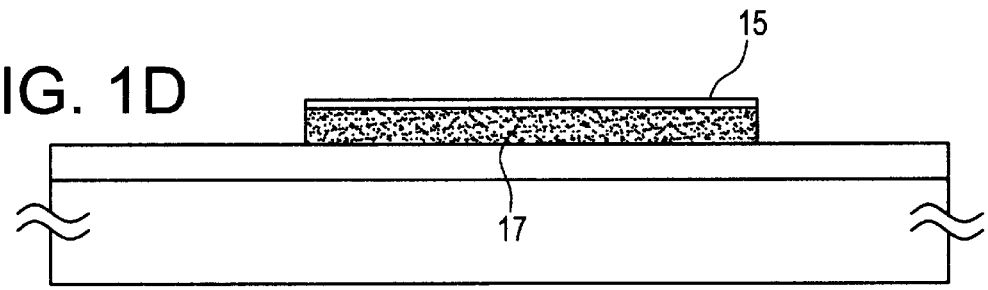
Figure 1E:
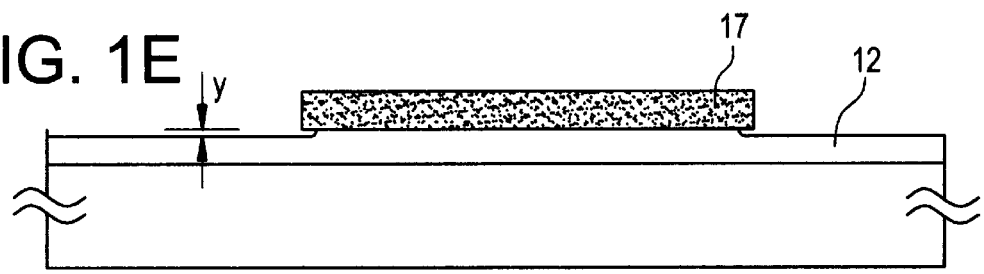

Subsequently, the silicon film 13 is patterned by a known photolithography with a photoresist mask (not shown in the figure) to thus obtain a silicon island 17 as shown in FIG. 1D. The thermal oxide film 15 functions as an impurity blocking layer from the photoresist. The reason of using the 1/100 HF solution rather than the stronger etchant like 1/10 BHF used in the previous step is that the controllability of the etching process can be improved by increasing the etching period of the silicon oxide film and thus minimizing the overetching of the underlying silicon film. As a result, the value "y" of the overetching in this example can be suppressed as small as 80Å–90 Å. (FIG. 1E)

Finally, the silicon oxide film 15 is etched using a 1/100 HF solution. Accordingly, a silicon island can be formed while a contamination by the photoresist is prevented.

EXAMPLE 2

The process in the second example of this invention will be described in conjunction with FIGS. 3A–3E. A Corning 7059 glass substrate (1.1 mm thick, 300 mm×400 mm) is used as a substrate 31. In the same manner as in the first example, the substrate is initially heated at 640° C. for one hour and then cooled to 580° C. at a cooling rate of 0.2° C./minute. A silicon oxide is deposited on the substrate 31 as a blocking layer 32 to a thickness of 2000Å by a plasma CVD. TEOS is used as a precursor gas and the substrate is maintained at 350° C.

Figure 3A:
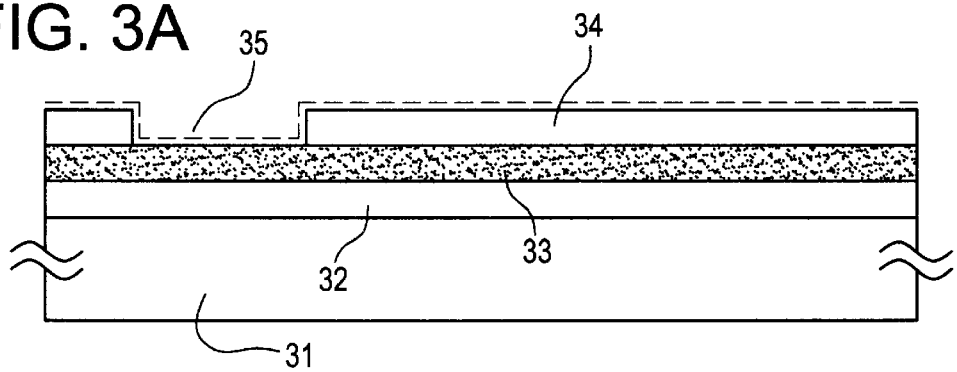
FIGS. 3A–3E show cross sectional diagrams showing a manufacturing process of the second example of the invention.

Then, an amorphus silicon layer 33 is formed to a thickness of 500Å by a LPCVD or plasma CVD on the blocking layer 32. Further, a silicon oxide layer 34 having a thickness of 1000Å is provided on the amorphous silicon layer 33 through a plasma CVD, following which a portion of the amorphous silicon 33 is exposed by patterning the silicon oxide layer by a known photolithography. Then, a thin nickel film 35 (10Å or less) is formed on the amorphous silicon layer 33 as shown in FIG. 3A.

Subsequently, the substrate is heated at 550° C. for 8 hours, or at 600° C. for 4 hours in nitrogen atmosphere in order to proceed a crystallization of the silicon film 33 in a direction shown by arrows of FIG. 3B by virtue of the crystallization promoting effect of the nickel.

After the crystallization, the silicon oxide layer 34 is removed with a 1/10BHF solution used as an etchant so that the surface of the silicon layer 33 which has been crystallized is exposed. (FIG. 3C)

Figure 3B:
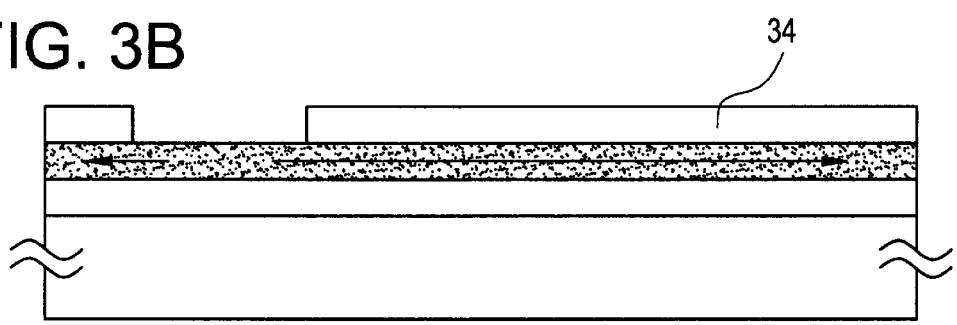
Figure 3C:
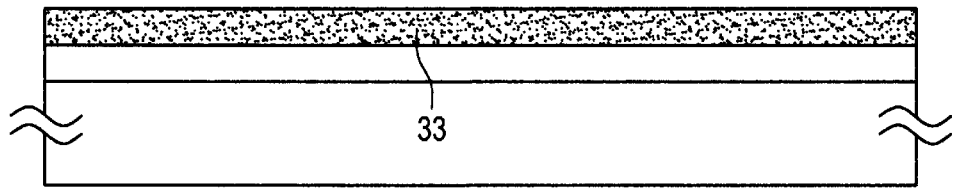
Figure 3D:
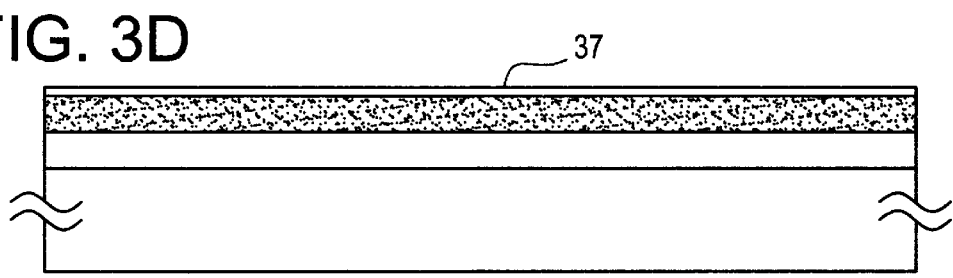

Then, in accordance with the present invention, the silicon layer 33 is subjected to an oxygen flow (7 cm$^3$/second) at 550° C. for one hour in order to form a silicon oxide layer 37 on the surface of the silicon layer as shown in FIG. 3D.

Next, the silicon layer 33 together with the silicon oxide layer 37 is patterned into a silicon island 38 by a known photolithography. At this time, care should be taken to remove the portion of the silicon film on which the nickel film was directly formed (see FIG. 3A) and to remove the portion which corresponds to a top end of the crystallization shown by the arrow of FIG. 3B. Subsequently, the silicon oxide layer 37 which remains on the silicon island 38 is removed by etching with 1/100HF solution as an etchant.

EXAMPLE 3

The process of the third example of this invention will be described in conjunction with FIGS. 4A to 4E. The same substrate 41 having a silicon oxide layer 42 and an amorphous silicon layer 43 is prepared in the same manner as in the previous examples.

Figure 4A:
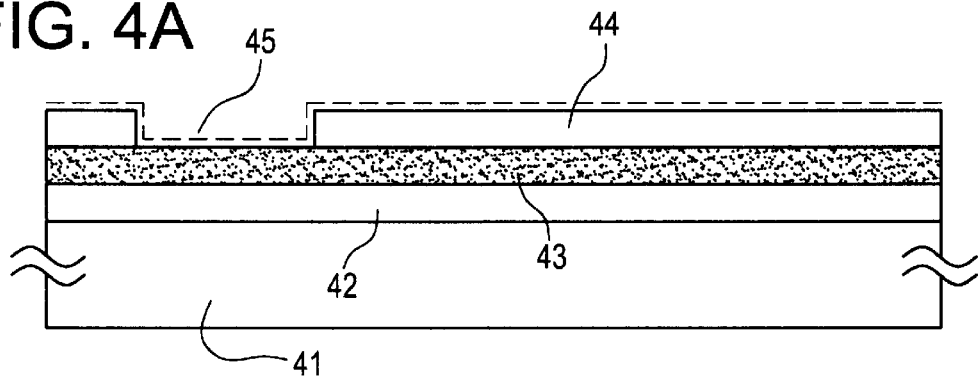
FIGS. 4A–4E show cross sectional diagrams showing a manufacturing process of the third example of the invention.

On the amorphous silicon film 43, a photoresist layer 44 is provided by spin coating to a thickness of 2 gm, following which the photoresist layer is patterned by a known photolithography in order to expose a portion of the silicon layer. Further, a nickel film 45 of a thickness 10Å or less is formed by a sputtering method. (FIG. 4A)

Figure 4B:
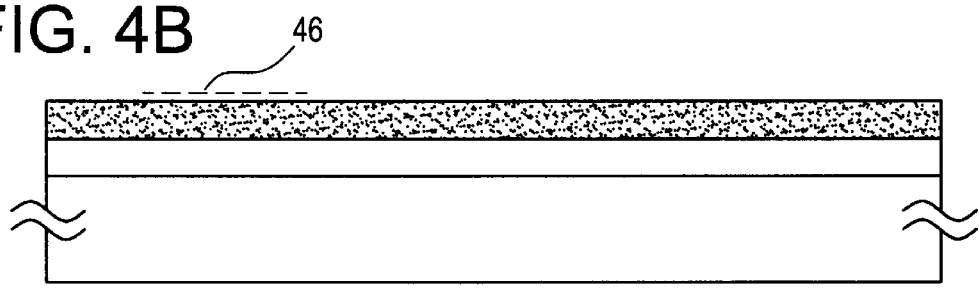
Figure 4C:
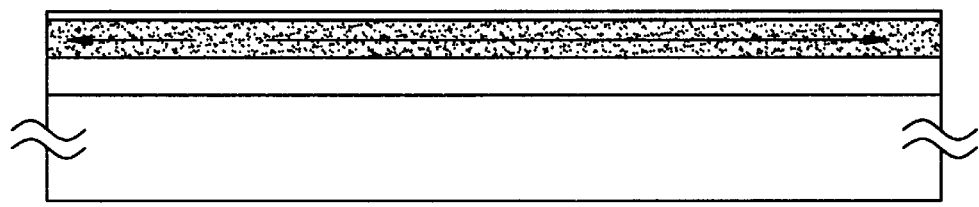

Then, as shown in FIG. 4B, the photoresist layer 44 is removed by a known process while the nickel film directly formed on the portion of the silicon layer (as designated with a reference numeral 46) remains unremoved.

Then, the substrate is heated at 550° C. for 8 hours, or at 600° C. for 4 hours in a nitrogen gas. As a result, the silicon layer is crystallized in a direction shown by the arrows in FIG. 4C by virtue of the crystallization promoting effect of the nickel.

Subsequently, the substrate is dipped in a nitric acid solution in order to form an oxide layer on the silicon layer. Then, this oxide film is removed by using 1/10BHF as an etchant. These steps are repeated several times. As a result, the surface of the silicon film is sufficiently cleaned and finally can expose a clean surface of the silicon layer even though the silicon film is once contacted with the photoresist layer.

Figure 4D:
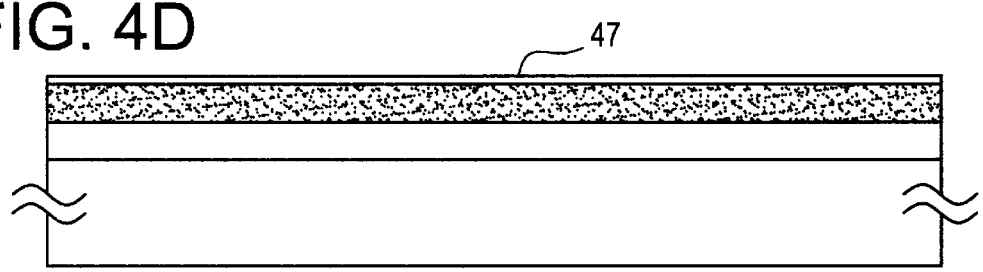
Figure 4E:
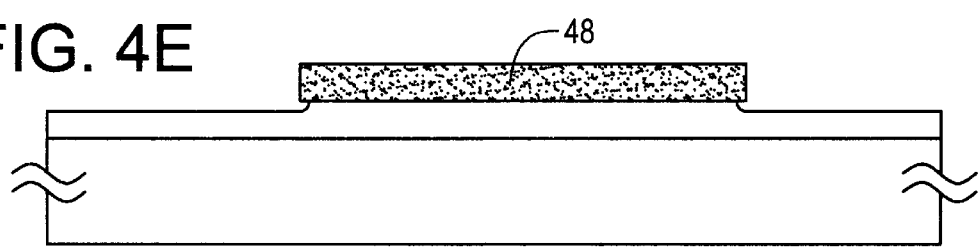

Then, referring to FIG. 4D, a silicon oxide 47 is formed on the silicon layer by thermally oxidizing the surface with a plasma of oxygen activated by microwave, at 200–400° C., for example, 300° C. The thickness of the silicon oxide layer is 40 to 60Å.

Finally, the silicon layer together with the silicon oxide layer is patterned through a known photolithography to form a silicon island 48 in a manner in that the region to become an active region of a TFT or TFD does not contain the added nickel at a high concentration. Thereafter, the silicon oxide layer 47 which remains on the silicon island 48 is etched off with a 1/100HF solution.

EXAMPLE 4

The process in accordance with the fourth example of the invention will be described in conjunction with FIGS. 5A–5E. Further, a description for manufacturing a TFT will be made.

Initially, the substrate 51 having the silicon oxide layer 52 and the amorphous silicon layer 53 is prepared entirely in the same manner as in the previous examples so that redundant explanations are omitted here.

Figure 5A:
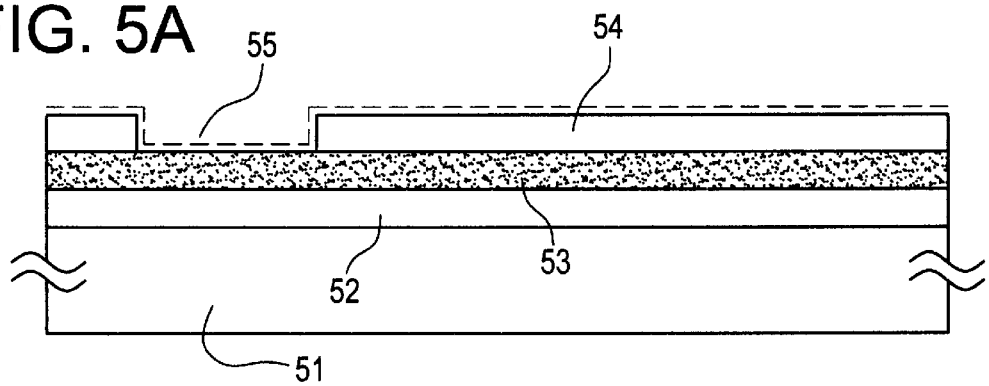
FIGS. 5A–5E show cross sectional diagrams showing a manufacturing process of the fourth example of the invention.

On the amorphous silicon layer 53 formed on the substrate 51, a silicon oxide layer 54 is deposited to a thickness of 1000Å through a plasma CVD, following which the silicon oxide layer is patterned to expose a portion of the silicon layer 53. A nickel film 55 of 200 Å thick is formed thereon by sputtering as shown in FIG. 5A.

Figure 5B:
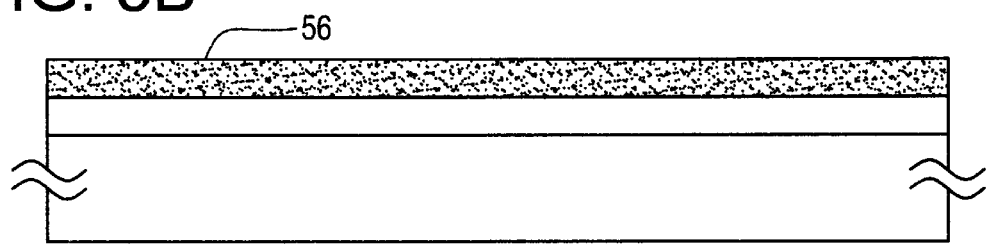

Then, the substrate is heated at 450° C. for one hour. As a result, a nickel silicide layer 56 in the region where the nickel is directly formed on the silicon layer as shown in FIG. 5B. Thereafter, the silicon oxide layer 54 is removed with 1/10BHF to expose the surface of the silicon layer 53.

Figure 5C:
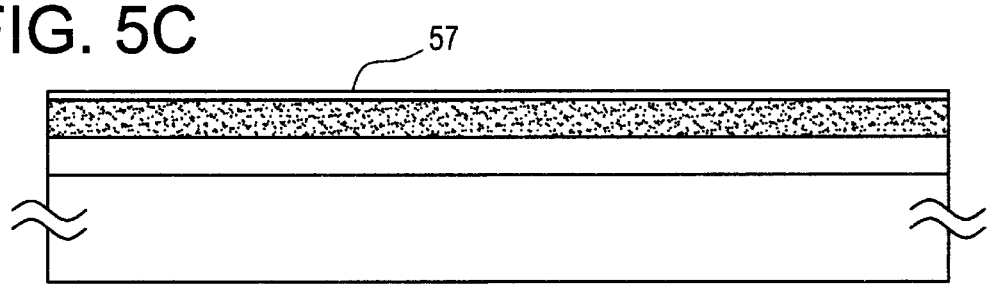

Then, a silicon oxide layer 57 is formed to a thickness of 40–60Å by thermally oxidizing the surface of the silicon film in an oxygen flow (7 cm$^3$/second) at 550° C. for one hour as shown in FIG. 5C.

Figure 5D:
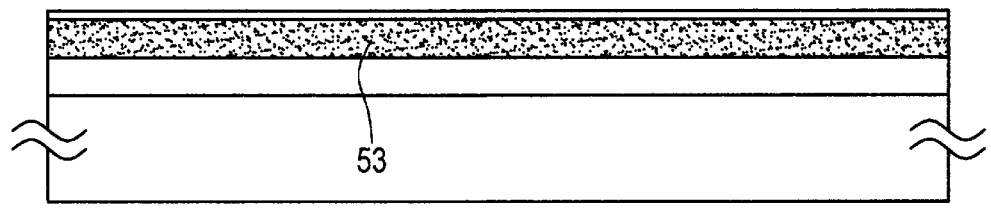
Figure 5E:
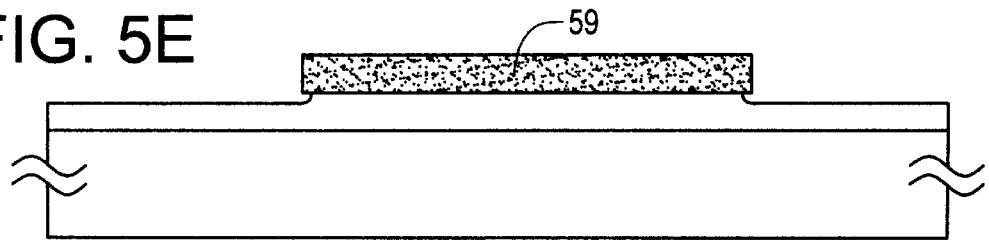

Subsequently, the oxygen gas is replaced by nitrogen in the furnace. The substrate is heated in nitrogen at 550° C. for 8 hours, or at 600° C. for 4 hours in order to crystallize the silicon film 53 by virtue of the crystallization promoting effect of the nickel. (FIG. 5D)

Then, a silicon island 59 is formed by patterning through a known photolithography process so that an active region of a semiconductor device such as TFT is defined. Thereafter, the silicon oxide layer 57 which remains on the silicon island is removed by using 1/100HF solution as an etchant.

Figure 6A:
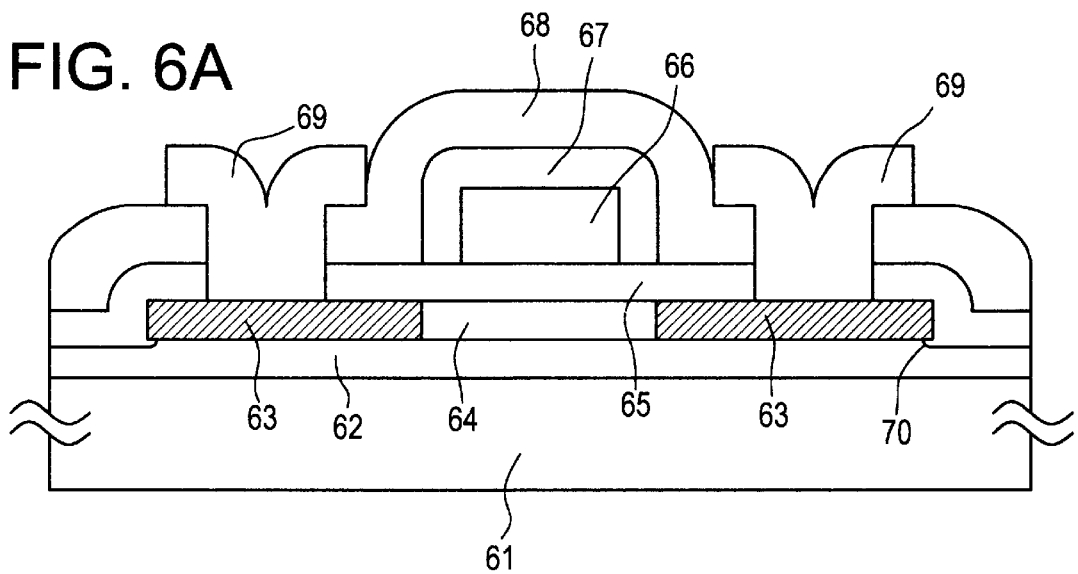
FIGS. 6A–6C show a TFT manufactured in accordance with the fifth example of the invention.
Figure 6B:
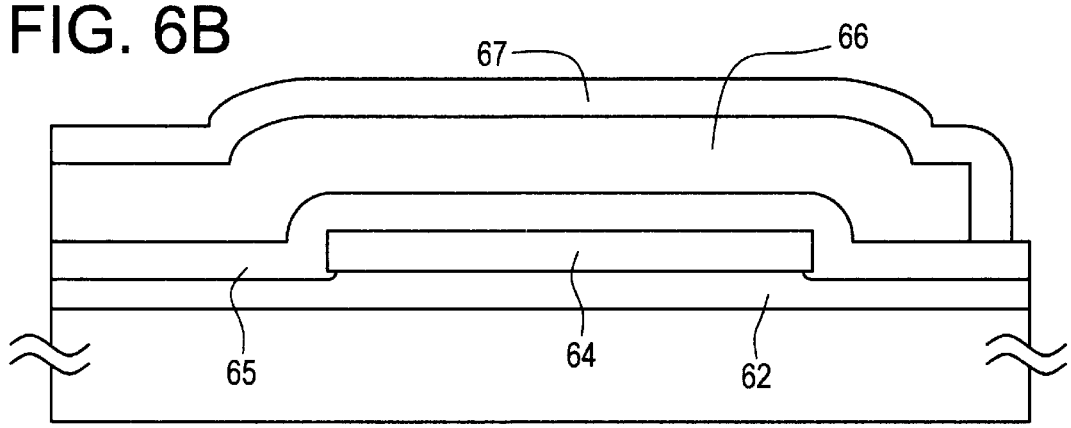
Figure 6C:
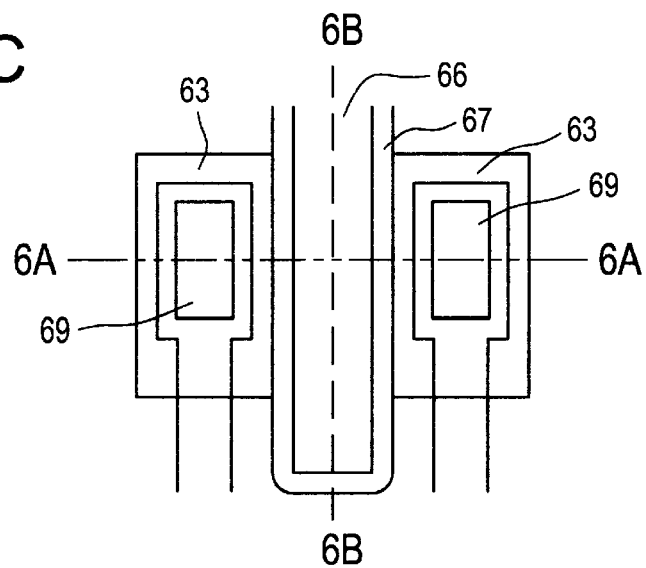

Using, the silicon island 59 thus obtained, a TFT is manufactured having a structure shown in FIGS. 6A–6C. FIG. 6C shows a plan view of the TFT. FIGS. 6A and 6B show A—A' and B—B' cross sections of FIG. 6C, respectively. Reference numeral 63 designates source and drain regions, 64 a channel region, 65 a gate insulating layer, 66 a gate electrode, 67 an oxide layer, 68 an interlayer insulating layer, 69 source/drain electrodes. In accordance with the present invention, since an undesirable overetching of the silicon oxide layer can be minimized, the gate insulating layer 65 and the gate electrode 66 can be formed with a good step coverage.

Further, as a material of the gate electrode, an aluminum alloy to which scandium is added at 18% is used. The oxide layer 67 is formed by anodizing this gate electrode. During the anodic oxidation, since there is little overetching at an edge of the silicon island, the gate electrode can be prevented from being broken. Thus, the production yield can be improved.

The characteristics of the TFT thus obtained are as follows: a mobility is 110–150 cm$^2$/Vs and S value 0.2–0.5 V/digit in the case of NTFT, a mobility 90–120 cm$^2$/Vs and S value 0.4–0.6 V/digit in the case of PTFT. The mobility can be increased by more than 1.2 times as compared with those of the conventionally obtained TFTs, and also the S value can be reduced to a half-value of the conventional value. The inventors consider this is because of the use of the thermal oxidation film when patterning the silicon film as a blocking film.

EXAMPLE 5

Referring again to FIGS. 3A–3E, the process of the fifth example of this invention will be described. Basically, the manufacturing process is the same as that of the second example except that the irradiation of KrF excimer laser (wavelength 248 nm) is used to form an oxide layer of the silicon film instead of thermal annealing of the second example. In the same manner as in the second example, a substrate is heated at 640° C. for an hour and then cooled at 0.2° C./min. to 580° C. in advance. Also, the underlying film 32 (silicon oxide, 2000Å thick), amorphous silicon layer 33 (500Å thick) and the silicon oxide layer 34 (1000Å thick) are formed. A portion of the silicon layer is exposed by selectively removing the silicon oxide film as shown in FIG. 3A.

Then, in this example, a thin nickel acetate film 35 is formed by spin coating. As a solvent, water or ethanol is used. Also, the concentration of the nickel acetate is 10–100 ppm.

Then, the substrate is heated at 550° C. for 8 hours so that the crystallization proceeds in a direction shown by arrows in FIG. 3B. The nickel functions to promote the crystallization.

After the silicon oxide film 34 is removed with 1/10BHF used as an etchant to expose the surface of the silicon film 33 as shown in FIG. 3C, the substrate is placed in an oxidizing atmosphere. Here, the surface of the silicon film is irradiated with the KrF excimer laser. The energy density is 250–450 mJ/cm$^2$, for example, 300 mJ/cm$^2$. The laser irradiation is done at 10–50 shots per one place. As a result, the silicon oxide layer 37 having a thickness of 10–50 Å is obtained. The energy density and the number of shots of the laser may be selected depending on the thickness of the silicon film 37 to be crystallized. Also, after the laser irradiation, a thermal annealing may be again performed after the laser irradiation in the above mentioned condition.

Figure 3E:
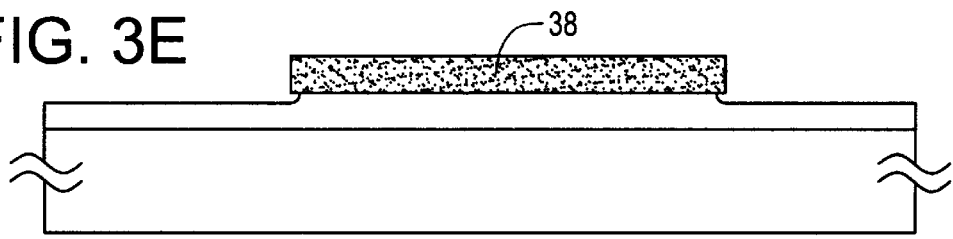

After the crystallization, the silicon film is patterned to remove the portion thereof on which the nickel acetate film is directly formed and the portion in which a top end of the crystals exist (corresponding to the top of the arrows in FIG. 3B). After that the silicon oxide layer 37 remaining on the silicon island is removed by using 1/100 HF solution. (FIG. 3E).

Instead of the laser, a halogen lamp may also be used. In this case, the irradiation duration should be controlled in order not deform the substrate due to the heat. With the thus formed silicon island, a TFT may be formed. Of course, a plurality of silicon islands may be formed on one substrate using the process of the invention and an array of TFTs may be formed.

COMPARATIVE EXAMPLE

Referring to FIGS. 2A–2E, a blocking layer 22 comprising silicon oxide was initially formed on a substrate 21 and then an amorphous silicon layer 23 was deposited by known method. Then, a protective layer 24 of the present invention such as silicon oxide, silicon nitride or the like was formed by physical vapor deposition (e.g. sputtering) or a chemical vapor deposition (e.g. plasma CVD, photo CVD).

Figure 2A:
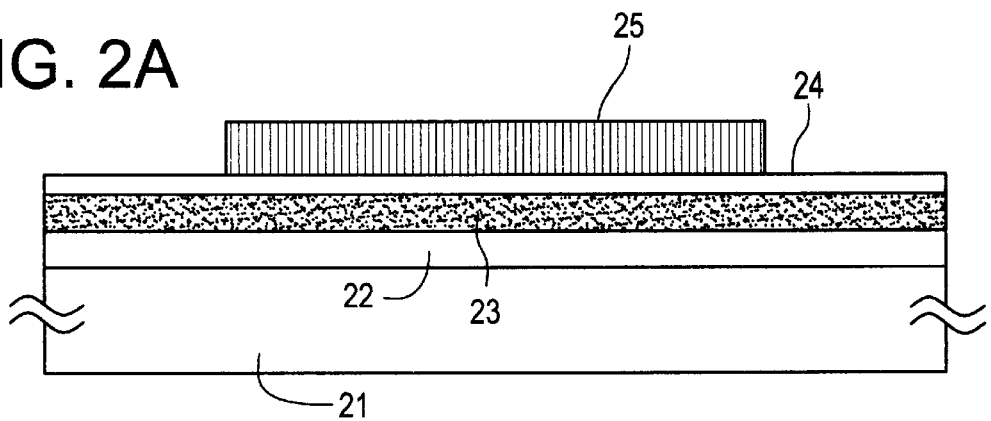
FIGS. 2A–2E show cross sectional diagrams showing a comparative example of the present invention.
Figure 2B:
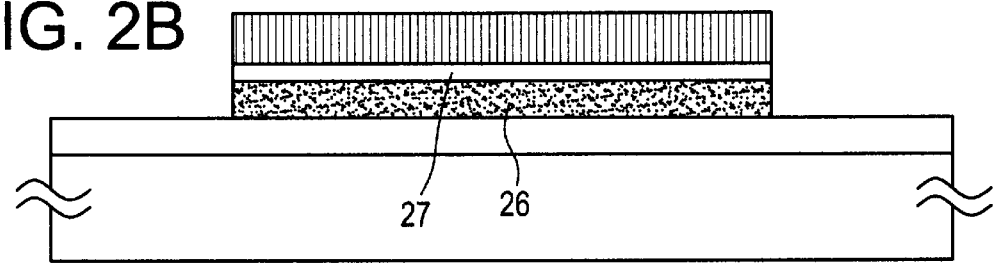

Further, a photoresist pattern 25 was formed by a known photolithography process. (FIG. 2A)

In this example, however, because the CVD or PVD were used, the obtained films are relatively porous as compared with the oxide layer obtained in the previous examples, therefore, it was necessary to use a thicker film, for example, several hundreds Å thick in order to ensure that the contamination of the silicon film by the photoresist is safely avoided.

The silicon film 23 together with the protective film 24 was patterned by dry or wet etching to pattern the silicon film 23 into an island 26 with the protective film 27 remaining thereon.

Figure 2C:
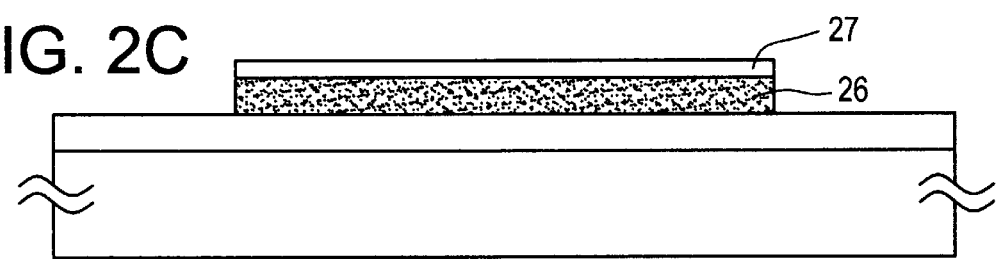
Figure 2D:
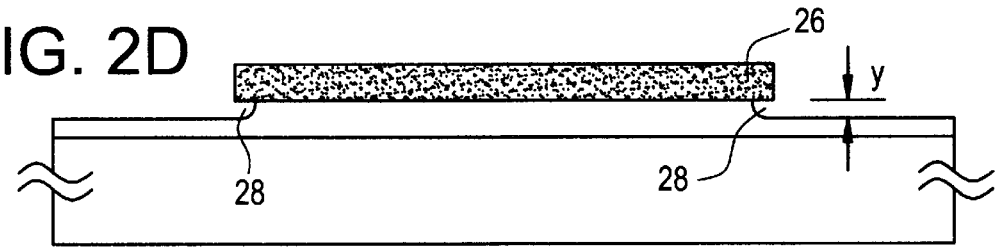
Figure 2E:
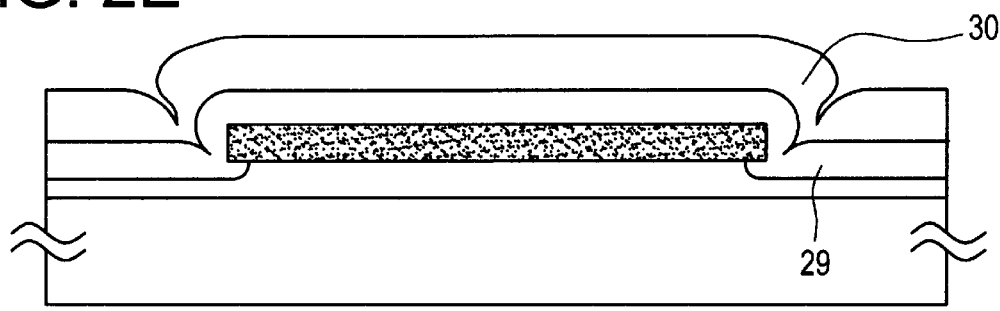

After removing the photoresist 25, the remaining protective film 27 was removed by wet etching as shown in FIG. 2C. At this time, because the protective film 27 was relatively thick, the underlying silicon oxide film 22 was overetched. The value of the overetching "y" was 500Å. (FIG. 2C) Therefore, a void 28 was unavoidably formed. The degree of the overetching "y" is determined by the difference in etching rate and in thickness between the protective layer 24 and the underlying layer 22. In this case, since a same material was used for both layers, it is unavoidable that the underlying layer is etched at at least the thickness of the protective layer 24. Also, since it is necessary to completely remove the protective layer 27, the degree of the overetching "y" naturally increases.

Although there is a possibility to select a material of the underlying film so that it has a higher etching resistivity than the protective layer 27, silicon oxide is most appropriate when considering the matching with the silicon semiconductor layer.

Consequently, because of the large degree of the overetching, a void 28 tends to be formed causing a decrease in the step coverage of the gate insulating layer 29 and the gate electrode 30 which are formed in the later step. Accordingly, the insulation between the gate electrode and the active layer can not be improved and a leak current tends to occur.

In particular, an etchant tends to penetrate through the void 28 so that it is likely that the gate electrode is etched from the lower surface and broken. In the same manner, if the gate electrode is oxidized by anodic oxidation in an electrolyte, the oxidation proceeds not only on the upper surface of the gate electrode but also on the portion close to the void 28, causing a breaking of the wiring also.

Accordingly, it is desirable to utilize a protective film which is sufficiently thin to minimize the overetching of the underlying film but is sufficiently dense and pinhole free. Therefore, the use of light or heat oxidation is preferable to achieve the purpose of the present invention. However, if a sufficiently dense and pinhole free film is obtainable even with a CVD, such a method should also be suitable to the present invention.

In accordance with the preferred embodiments of the invention, the overetching of the underlying film during the formation of the semiconductor islands can be reduced, a step coverage of the gate insulating layer and the gate electrode is improved, and further a leak current between a gate electrode and a silicon layer is reduced. In particular, because of the use of the protective film which is formed by thermal or light oxidation at 20–100Å, it is possible to suppress the overetching to 100Å or less.

Also, in accordance with another aspect the invention, a gate insulating layer can be formed by forming a thin oxide layer (30–300Å) by the thermal oxidation or light oxidation, following which another silicon oxide film is laminated thereon by a conventional CVD. Thus, it is possible to completely stop the void (gap) 70 shown in FIG. 6A.

While several examples have been descried, the present invention should not be limited to these particular examples. Many modifications may be made without departing the scope of the appended claims. For example, although only a photoresist has been disclosed as a mask material, the foregoing teaching should be applicable to any mask material.

What is claimed is:

1. A method for manufacturing a semiconductor device comprising the following sequential steps of:

forming a crystallized semiconductor film comprising silicon containing a catalyst metal for promoting crystallization of said semiconductor film on an insulating surface of a substrate;

treating a surface of said semiconductor film in an oxidizing atmosphere after forming said crystallized semiconductor film with a thermal annealing at 400–700° C. or with a photo annealing to form an oxide layer on said semiconductor film;

coating a photoresist on said oxide layer;

selectively etching said oxide layer and said semiconductor film;

removing said photoresist to expose said oxide layer under said photoresist; and removing said oxide layer.

2. The method of claim 1 further comprising the step of irradiating said silicon film with a light.

3. A method for manufacturing a semiconductor device comprising the following sequential steps of:

forming an amorphous semiconductor film comprising silicon on an insulating surface of a substrate;

forming a layer in contact with said amorphous semiconductor film which contains a catalyst metal for promoting crystallization of said semiconductor film;

crystallizing said amorphous semiconductor film;

exposing a surface of said semiconductor film to an oxidizing atmosphere after said crystallizing;

treating said surface in said oxidizing atmosphere with a thermal annealing at 400–700° C. or photoannealing in order to form an oxide layer on said semiconductor film;

forming a photoresist on said oxide layer;

selectively etching said oxide layer and said semiconductor film; and removing said photoresist and said the oxide layer under said photoresist.

4. The method of claim 3 further comprising the step of heating said amorphous silicon film at 400–700° C. in order to crystallize said film.

5. The method of claim 3 further comprising the step of crystallizing said amorphous silicon film in a horizontal direction.

6. A method for manufacturing a semiconductor device comprising the following sequential steps of:

forming a silicon oxide layer over a substrate;

forming a non-single crystalline semiconductor layer on said silicon oxide layer;

disposing a catalyst capable of promoting crystallization of said semiconductor layer in contact with said semiconductor layer;

crystallizing said semiconductor layer with the aid of said catalyst;

exposing a surface of said semiconductor layer to an oxidizing atmosphere with heating after crystallizing said semiconductor layer in order to oxidize the surface of said semiconductor layer to form an oxide layer thereon;

selectively forming a mask on said semiconductor layer with said oxide layer interposed therebetween, said mask comprising an organic material;

selectively etching said semiconductor layer together with said oxide layer by using said mask; and removing said mask and said oxide layer underlying said mask.

7. The method of claim 6 wherein said semiconductor layer comprises silicon.

8. The method of claim 6 wherein further comprising source and drain regions within said semiconductor layer.

9. The method of claim 6 wherein said semiconductor layer is heated at 400–700° C. in said oxidizing atmosphere.

10. The method of claim 6 wherein said mask comprises a photoresist.

11. The method of claim 6 wherein said oxide layer is removed by wet etching.

12. A method for manufacturing a semiconductor device comprising the steps of:

forming a silicon oxide layer over a substrate;

forming a non-single crystalline semiconductor layer on said silicon oxide layer;

disposing a catalyst metal containing material in contact with said non-single crystalline semiconductor layer;

crystallizing said semiconductor layer with said catalyst metal containing material;

exposing a surface of said semiconductor layer to an oxidizing atmosphere while irradiating said semiconductor layer with light in order to oxidize the surface of said semiconductor layer to form an oxide layer thereon after crystallizing said semiconductor layer;

selectively forming a mask on said semiconductor layer with said oxide layer interposed therebetween, said mask comprising an organic material;

selectively etching said semiconductor layer together with said oxide layer by using said mask; and removing said mask and said oxide layer underlying said mask.

13. The method of claim 12 wherein said semiconductor layer comprises silicon.

14. The method of claim 12 wherein further comprising source and drain regions within said semiconductor layer.

15. The method of claim 12 wherein said mask comprises a photoresist.

16. The method of claim 12 wherein said oxide layer is removed by wet etching.

17. The method of claim 12 wherein said light is emitted from a light source selected from the group consisting of excimer laser, YAG laser, $CO_2$ laser, ruby laser, xenon lamp, krypton arc lamp and halogen lamp.

18. The method of claim 1 wherein said catalyst metal is at least one selected from the group consisting of Fe, Co, Ni, Ru, Rh, Pd, Os, Ir, Pt, Sc, Ti, V, Cr, Mn, Cu, Zn, Au and Ag.

19. The method of claim 3 wherein said catalyst metal is at least one selected from the group consisting of Fe, Co, Ni, Ru, Rh, Pd, Os, Ir, Pt, Sc, Ti, V, Cr, Mn, Cu, Zn, Au and Ag.

20. The method of claim 6 wherein said catalyst comprises at least a metal selected from the group consisting of Fe, Co, Ni, Ru, Rh, Pd, Os, Ir, Pt, Sc, Ti, V, Cr, Mn, Cu, Zn, Au and Ag.

21. The method of claim 12 wherein said catalyst metal is at least one selected from the group consisting of Fe, Co, Ni, Ru, Rh, Pd, Os, Ir, Pt, Sc, Ti, V, Cr, Mn, Cu, Zn, Au and Ag.

22. A method of manufacturing a semiconductor device comprising the steps of:

forming a semiconductor film comprising silicon on an insulating surface;

disposing a catalyst containing material in contact with said semiconductor film, said catalyst capable of promoting a crystallization of silicon;

crystallizing said semiconductor film with the aid of said catalyst;

oxidizing a surface of said semiconductor film to form an oxide layer thereon; and removing said oxide film in order to expose a surface of said semiconductor film.

23. The method of claim 22 wherein said oxide layer is formed by thermal oxidation.

24. The method of claim 22 wherein said oxide layer is formed by photo oxidation.

25. The method of claim 22 wherein said catalyst metal is at least one selected from the group consisting of Fe, Co, Ni, Ru, Rh, Pd, Os, Ir, Pt, Sc, Ti, V, Cr, Mn, Cu, Zn, Au and Ag.

26. A method of manufacturing a semiconductor device comprising the steps of:

forming a semiconductor film comprising silicon on an insulating surface;

disposing a catalyst containing material in contact with said semiconductor film, said catalyst capable of promoting a crystallization of silicon;

crystallizing said semiconductor film with the aid of said catalyst by heating;

further crystallizing said semiconductor film by irradiating said semiconductor film with laser light after said heating;

oxidizing a surface of said semiconductor film to form an oxide layer thereon; and removing said oxide film in order to expose a surface of said semiconductor film.

27. The method of claim 26 wherein said oxide layer is formed by thermal oxidation.

28. The method of claim 26 wherein said oxide layer is formed by photo oxidation.

29. The method of claim 26 wherein said catalyst metal is at least one selected from the group consisting of Fe, Co, Ni, Ru, Rh, Pd, Os, Ir, Pt, Sc, Ti, V, Cr, Mn, Cu, Zn, Au and Ag.

* * * * *